United States Patent [19]
Lee

[11] Patent Number: 6,078,784
[45] Date of Patent: Jun. 20, 2000

[54] MULTI-TAP RADIO FREQUENCY MODULATOR

[75] Inventor: Jong Jin Lee, Kyongki-do, Rep. of Korea

[73] Assignee: Samsung Electro-Mechanics Co., Ltd., Kyongki-Do, Rep. of Korea

[21] Appl. No.: 08/989,588

[22] Filed: Dec. 12, 1997

[30] Foreign Application Priority Data

Jun. 5, 1997 [KR] Rep. of Korea ............ 97-23478

[51] Int. Cl.[7] .................................... H04H 1/02
[52] U.S. Cl. ................... 455/6.2; 348/6; 348/10; 455/6.3; 455/338; 333/100; 333/124; 333/131
[58] Field of Search .................... 333/100, 124, 333/131; 455/338, 6.2, 6.3; 348/6, 10

[56] References Cited

U.S. PATENT DOCUMENTS 3,881,160 4/1975 Ross ............................... 333/124
5,119,396 6/1992 Snderford, Jr. .
5,347,245 9/1994 Wright, Jr. ...................... 333/131

*Primary Examiner*—Andrew I. Faile
*Assistant Examiner*—Sam Huang
*Attorney, Agent, or Firm*—Renner, Otto, Boisselle & Sklar, LLP

[57] ABSTRACT

A multi-tap RF modulator includes an amplifier for amplifying a telecast RF signal input to an antenna input port; a modulation section for modulating the RF signal output from a VCR, SVR, or game player; and a mixer/splitter having more than one RF output tap and for mixing the first RF signal output from the amplifier and the second RF signal output from the modulation section, the mixed RF signals being distributed into more than one RF signal. The modulator with more than one output tap enables a user to view several TV sets at the same time.

6 Claims, 9 Drawing Sheets

MULTI-TAP RADIO FREQUENCY MODULATOR

FIELD OF THE INVENTION

The present invention relates to a radio frequency (RF) modulator which loads voice/data signals on a carrier signal through frequency modulation or phase modulation. More particularly, this invention deals with a multi-tap RF modulator having at least two output taps to thereby allow several television sets to be viewed at the same time.

BACKGROUND OF THE INVENTION

FIG. 1 is a perspective of a conventional RF modulator, reference numeral 11 being an antenna's input port and 12 being an RF signal output port given to a TV set.

FIG. 2A is a block diagram of the conventional RF modulator, and FIG. 2B is a circuit diagram of mixer 23 shown in FIG. 2A. Referring to FIG. 2A, the RF modulator includes an amplifier 21 for amplifying a telecast RF signal input through ANT input port, a modulation section 22 for modulating RF signals of video cassette recorder (VCR), satellite video receiver (SVR), or game player, and a mixer 23 having an RF output tap and for mixing the first RF signal RF1 output from amplifier 21 and the second RF signal RF2 output from modulation section 22 into a third RF signal RF3 which is then provided to a TV set through the output tap. In FIG. 2B mixer 23 is made with a mixer transformer T21 which mixes the first RF signal RF1 output from amplifier 21 and the second RF signal RF2 output from modulation section 22 into a third RF signal RF3.

According to the prior art, one RF modulator enables only a single not multiple TVs to be viewed. Several TVs can be viewed simultaneously with several RF modulators connected in parallel. However, in this case the RF modulators occupy much volume, and their mounting is not so easy, decreasing economic efficiency as well.

SUMMARY OF THE INVENTION

Therefore, in order to overcome such drawbacks of the prior art, an objective of the present invention is to provide a multi-tap RF modulator which has at least two output taps in order to allow at least two TV sets to be viewed at the same.

To accomplish the object of the present invention, there is provided a multi-tap RF modulator comprising: an amplifier for amplifying a telecast RF signal input to an antenna input port; a modulation section for modulating the RF signal output from a VCR, SVR, or game player; and a mixer/splitter having more than one RF output tap and for mixing the first RF signal output from the amplifier and the second RF signal output from the modulation section, the mixed RF signals being distributed into more than one RF signal. The present invention is characterized in that more than one output tap of the modulator enables a user to view several TV sets at the same time.

BRIEF DESCRIPTION OF THE ATTACHED DRAWINGS

These and other features of the invention will be understood more clearly from the following description, read in conjunction with the drawings, in which.

DETAILED DESCRIPTION OF THE INVENTION

Hereinafter, preferred embodiments of the present invention will be described in detail with reference to the attached drawings. First, a double-tap RF modulator is explained.

Figure 1:
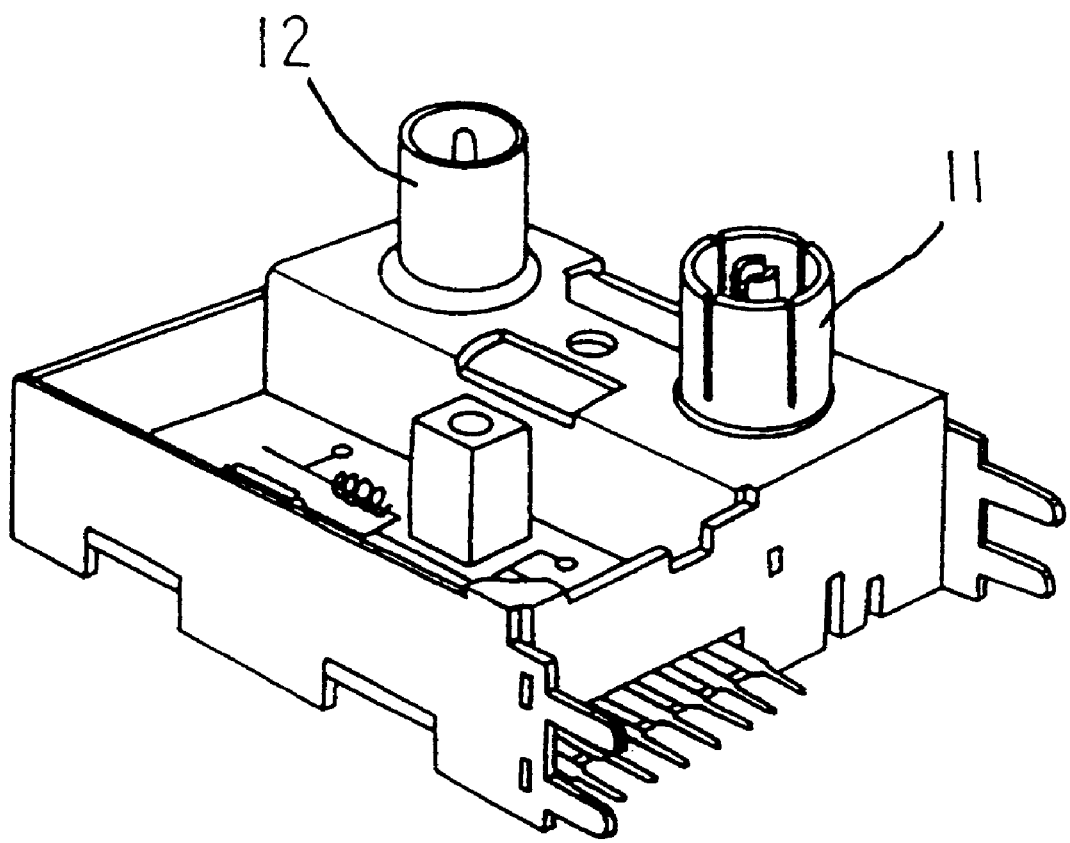
FIG. 1 is a perspective of a conventional RF modulator.
Figure 2A:
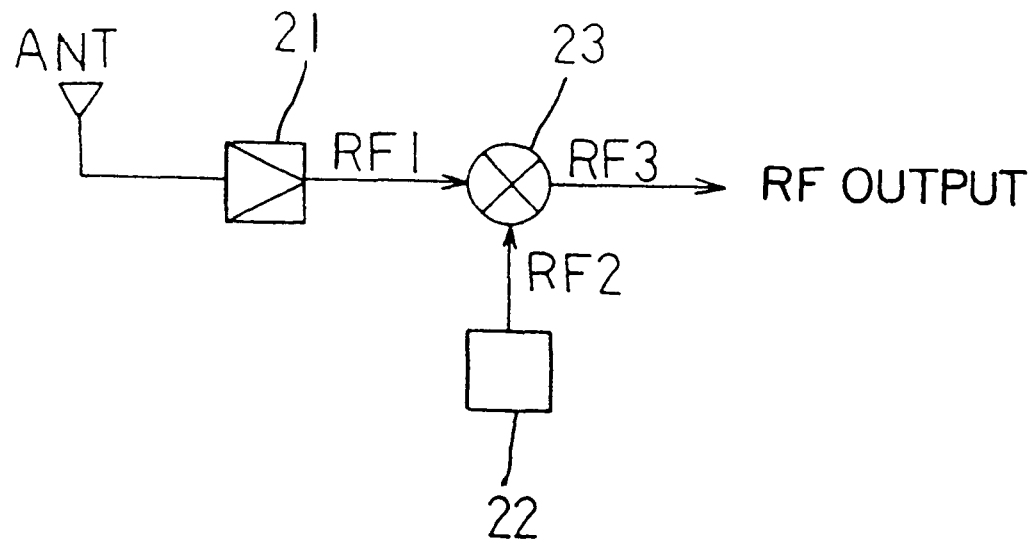
FIG. 2A is a block diagram of the conventional RF modulator.
Figure 2B:
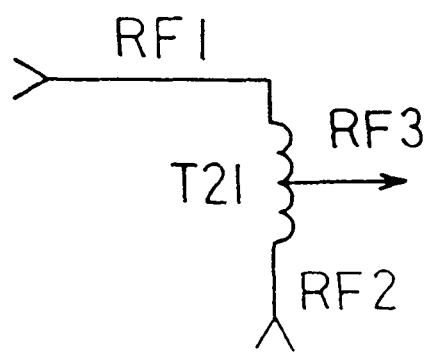
FIG. 2B is a circuit diagram of the mixer shown in FIG. 2A.
Figure 3:
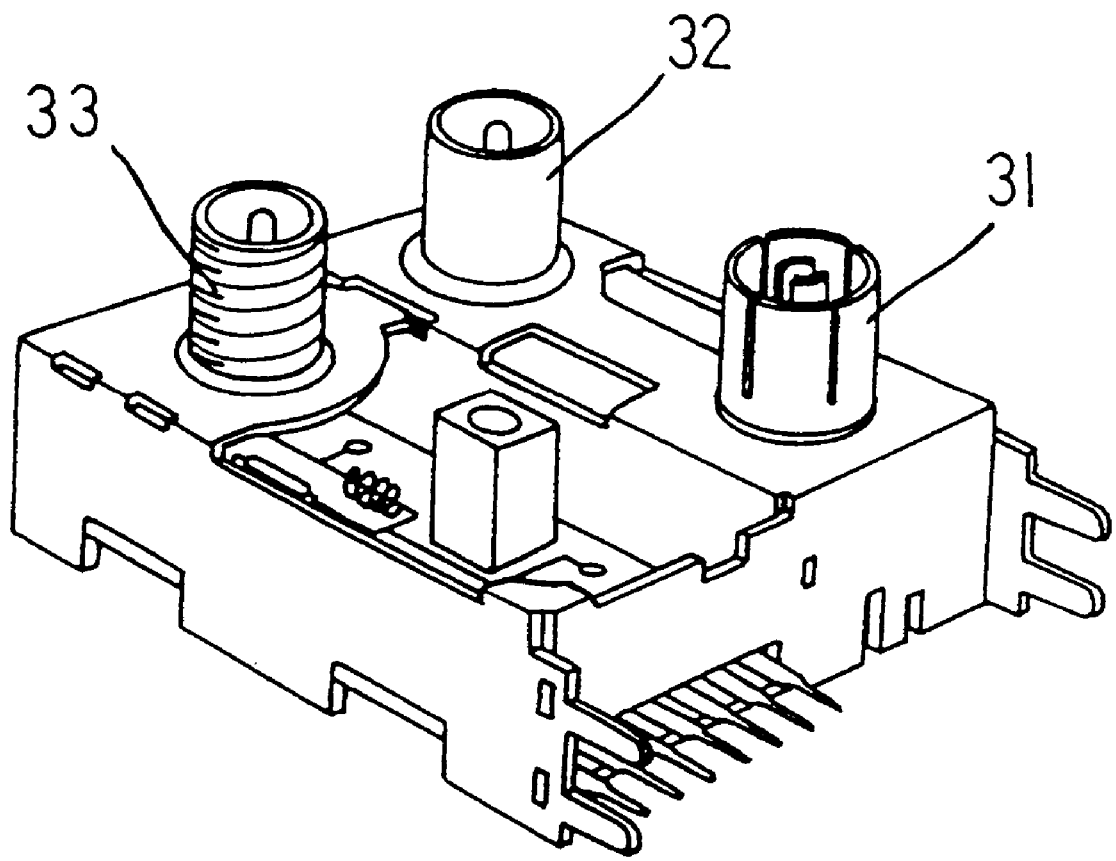
FIG. 3 is a perspective of a first embodiment of a multi-tap RF modulator of the present invention in which two output taps are provided.

In FIG. 3 reference numeral 31 is an antenna's input port, and 32 and 33, respectively, RF signal output ports provided to TV sets. One port 33 of the two is formed with a screw thread on the surface in order not to come out in connection with remote TV sets.

Figure 4:
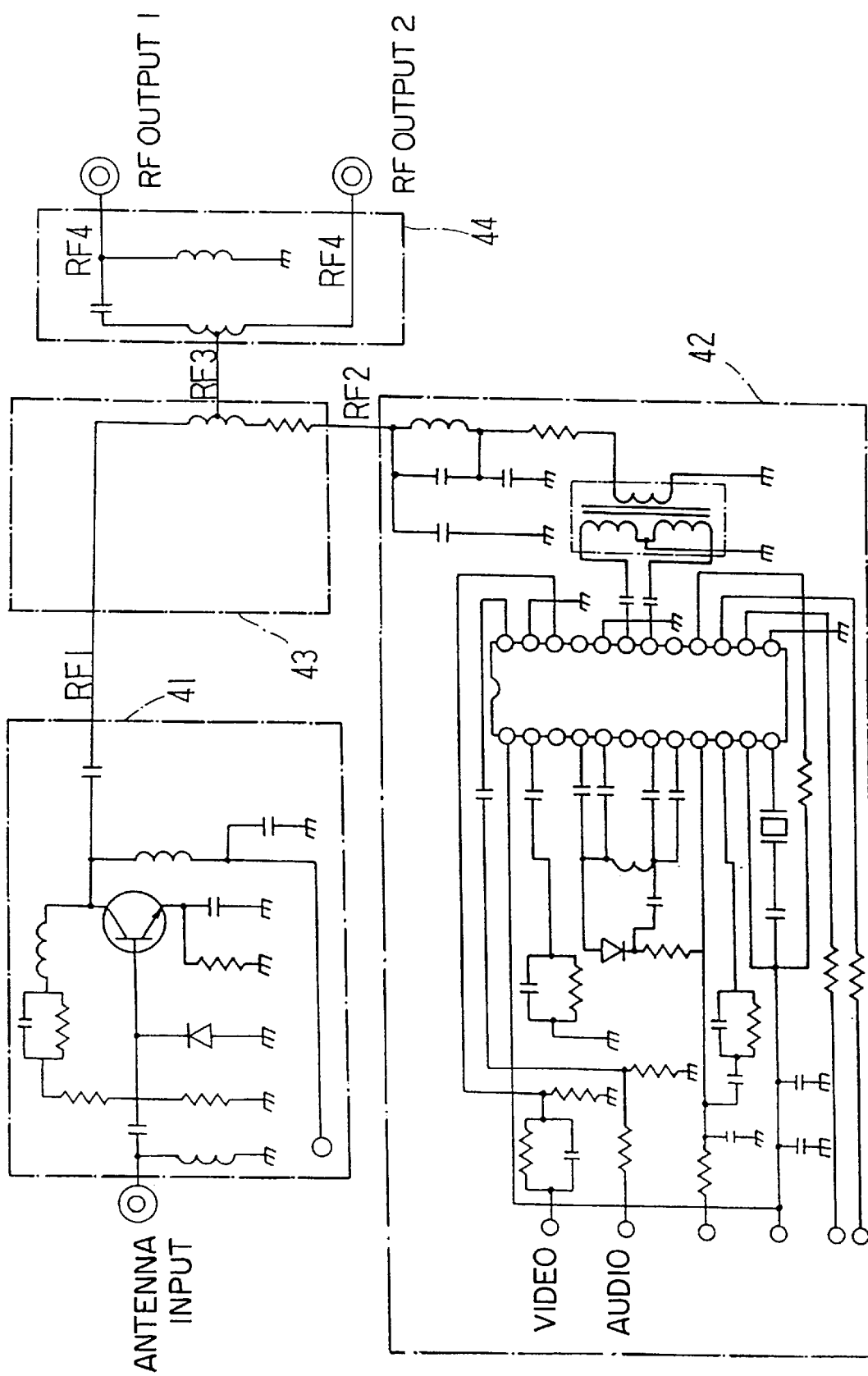
FIG. 4 is a block diagram of the first embodiment of multi-tap RF modulator of the present invention with two output taps.

Referring to FIG. 4, the first embodiment of multi-tap modulator comprises an amplifier 41 for amplifying a telecast RF signal input through ANT input port, a modulation section 42 for modulating RF signals of video cassette recorder (VCR), satellite video receiver (SVR), or game player, a mixer/splitter made up with a mixer 43 for mixing the first RF signal RF1 output from amplifier 41 and the second RF signal RF2 output from modulation section 42, and a splitter 44 for dividing signal RF3 output from mixer 43 into two signals RF4, and two RF output taps for providing those two signals to two TV sets. Amplifier 41, modulation section 42 and mixer/splitter are received in a case having an antenna input port 31 and at least two RF output taps 32 and 33, as in FIG. 3.

Figure 5A:
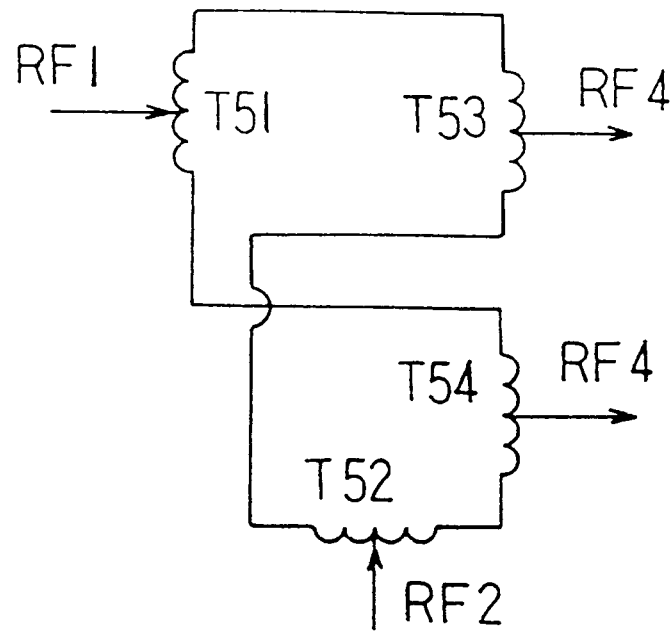
FIG. 5A is a circuit diagram of a first embodiment of the mixer/splitter in the first embodiment of the RF modulator of the present invention.

Turning to FIG. 5A, the first embodiment circuit of mixer/splitter has a first distribution transformer T51 for distributing the first RF signal RF1 output from the amplifier, a second distribution transformer T52 for distributing the second RF signal RF2, and first and second mixer transformers T53 and T54 for mixing the first RF signal RF1 distributed in first distribution transformer T51, and the second RF signal RF2 distributed in second distribution transformer T52 and then outputting an RF signal RF4.

Figure 5B:
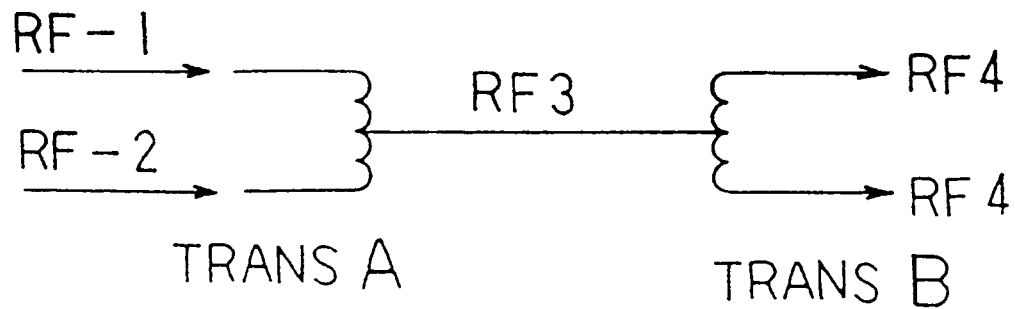
FIG. 5B is a circuit diagram of a second embodiment of the mixer/splitter in the first embodiment of the RF modulator of the present invention.

Referring to FIG. 5B, the second embodiment circuit of mixer/splitter is made up with, if only two RF outputs 1 and 2 are required, a mixer transformer (trans A) in which two signals RF1 and RF2 are mixed, and a distribution transformer (trans B) that divides the mixed signal into two.

Figure 6:
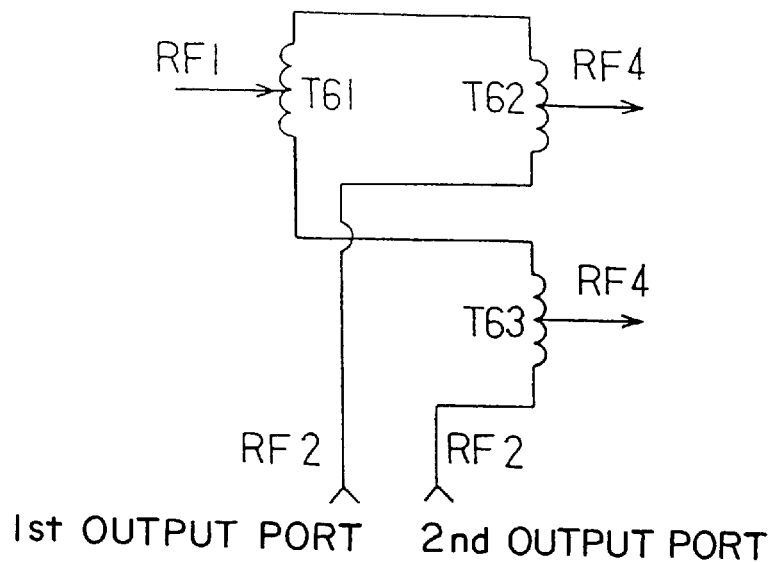
FIG. 6 is a circuit diagram of a third embodiment of the mixer/splitter in the first embodiment of the RF modulator of the present invention.

FIG. 6 shows the third embodiment circuit of mixer/splitter which has a distribution transformer T61 for distributing the first RF signal RF1 output from the amplifier, a first mixer transformer T62 for mixing the first RF signal RF1 distributed in distribution transformer T61 and the second RF signal RF2 output from the first output port of modulation section 42 and then outputting an RF signal RF4, and a second mixer transformer T63 for mixing the first RF signal RF1 distributed in distribution transformer T61 and the second RF signal RF2 output from the second output port of modulation section 42 and then outputting an RF signal RF4.

The operation of the double-tap RF modulator of the present invention will be explained in detail with reference to FIGS. 4, 5A, 5B and 6.

Given that the telecast RF signal input to the ANT's input port and amplified in amplifier 41 be the first RF signal RF1, and the output signal of modulation section 42 which modulates the RF signal of VCR or game player be the second RF signal RF2, the first RF signal RF1 output from amplifier 41 and the second RF signal RF2 output from modulation section 42 are mixed in mixer 43. The output signal of mixer 43, the third RF signal RF3, is divided into two fourth RF signals RF4 in splitter 44. Two RF output taps are formed to offer the fourth RF signal RF4 to two TV sets.

In order to form the two RF output signals, the mixer/splitter is made as in FIG. 5A. The first RF signal RF1 output from amplifier 41 is distributed in first distribution transformer T51, and flows through the upper end of first and second mixer transformers T53 and T54. Similarly, the second RF signal RF2 output from modulation section 42 is distributed in second distribution transformer T52, and flows through the lower end of first and second mixer transformers T53 and T54. The first and second mixer transformers T53 and T54 each mix the first RF signal RF1 distributed in first distribution transformer T51 and the second RF signal RF2 distributed in distribution transformer T52, and then output the mixed signals to form two RF output signals.

In order to form at least two RF signals, another embodiment of the mixer/splitter is made as in FIG. 5B. If only two RF outputs RF4 are required, the mixer/splitter is constructed to have a mixer transformer trans A where two signals RF1 and RF2 are mixed and a distribution transformer trans B where the mixed signal is divided into two. The two signals RF1 and RF2 to be mixed are applied across mixer transformer trans A. At the medium tap of mixer transformer trans A, the mixed signal RF3 is output. The signal RF3 is applied to distribution transformer trans B via its medium tap so that RF outputs RF4 are output at both ends of trans B.

Still another embodiment of the mixer/splitter is made as in FIG. 6. If modulation section 42 has first and second output ports, the first RF signal RF1 output from amplifier 41 is distributed in distribution transformer T61 to flow through the upper end of first and second mixer transformers T62 and T63. In a similar way, the second RF signal RF2 of the first output port output from modulation section 42 flows through the lower end of first mixer transformer T62, and the second RF signal RF2 of the second output port output from modulation section 42 runs through the lower end of the second mixer transformer T63. The first mixer transformer T62 mixes the first RF signal RF1 distributed in distribution transformer T61 and the second RF signal RF2 output from the first output port of the modulation section in order to output RF signal RF4. The second mixer transformer T63 mixes the first RF signal RF1 distributed in distribution transformer T61 and the second RF signal RF2 output from the second output port of the modulation section in order to output RF signal RF4. Through the above procedure, two RF output signals are formed.

Figure 7:
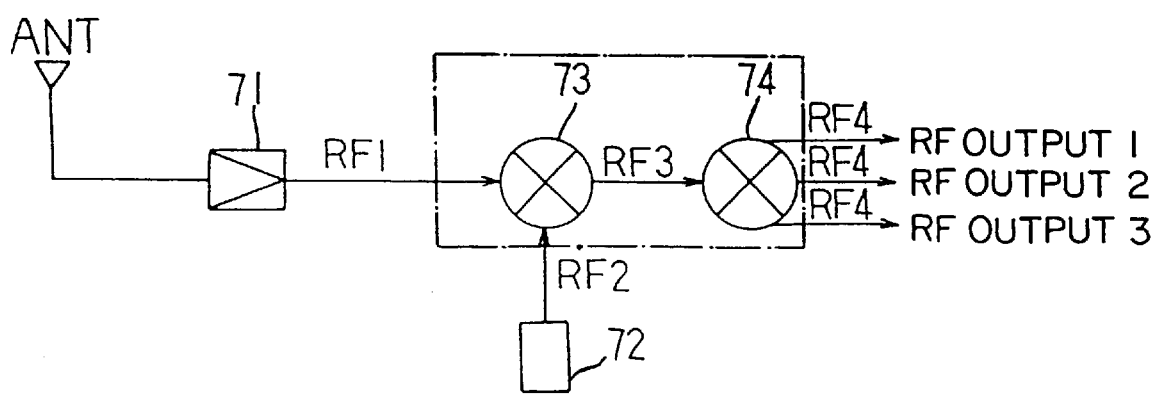
FIG. 7 is a block diagram of a second embodiment of RF modulator of the present invention where three output taps are provided.

From now on, as a multi-tap RF modulator of the present invention, an RF modulator having three output taps is explained with reference to the attached drawings. Referring to FIG. 7, the second embodiment of multi-tap modulator comprises an amplifier 71 for amplifying a telecast RF signal input through ANT input port, a modulation section 72 for modulating RF signals of video cassette recorder (VCR), satellite video receiver (SVR), or game player, a mixer/splitter (one-dash-one-dot) made up with a mixer 73 for mixing the first RF signal RF1 output from amplifier 71 and the second RF signal RF2 output from modulation section 72, and a splitter 74 for dividing signal RF3 output from mixer 73 into three signals RF4, and three RF output taps for providing those three signals to three TV sets.

Figure 8:
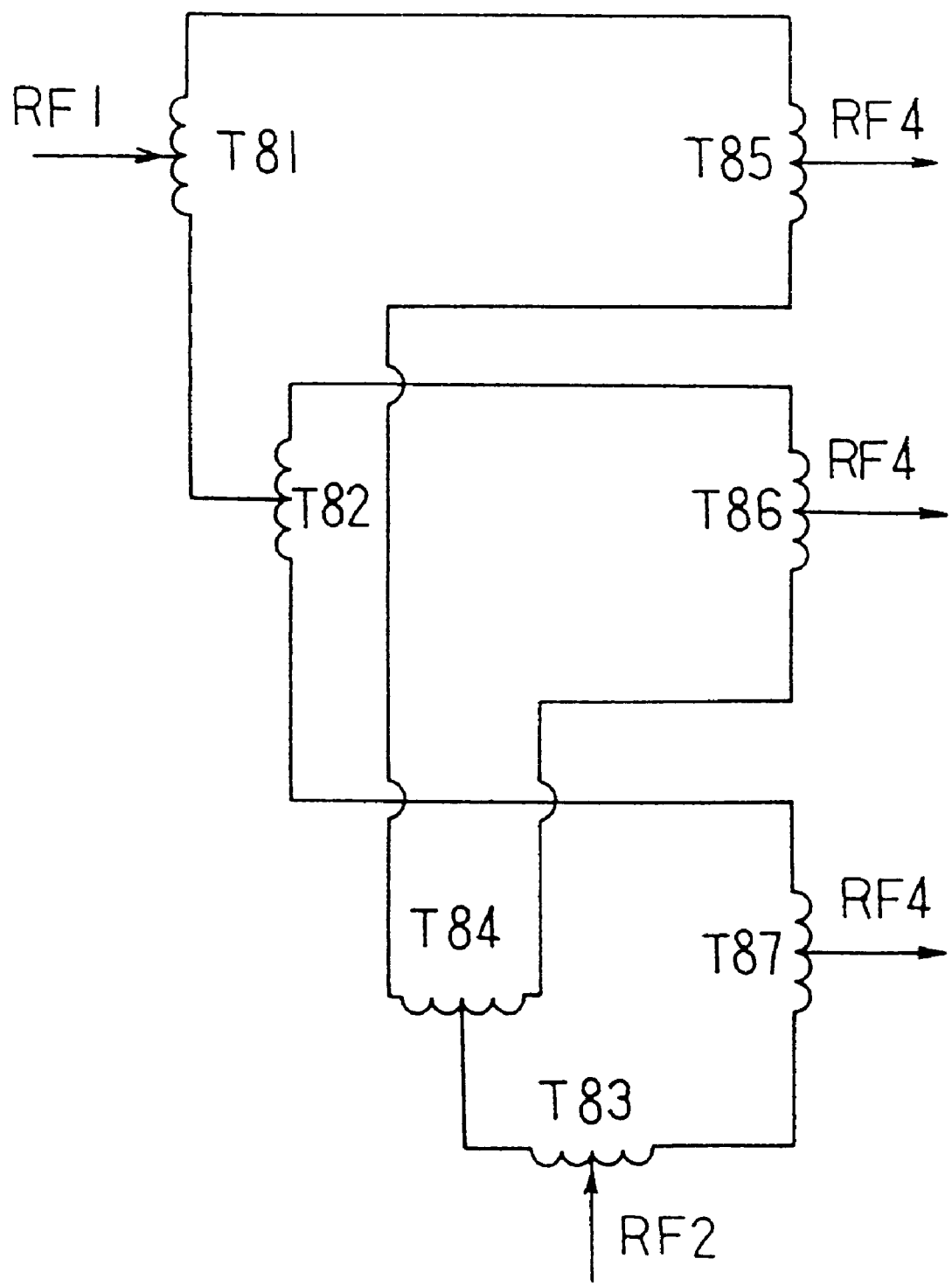
FIG. 8 is a circuit diagram of a fourth embodiment of the mixer/splitter in the second embodiment of the RF modulator of the present invention.

Turning to FIG. 8, the fourth embodiment circuit of the mixer/splitter has a first distribution transformer T81 for distributing the first RF signal RF1, a second distribution transformer T82 for distributing the first RF signal RF1 distributed in first distribution transformer T81, a third distribution transformer T83 for distributing the second RF signal RF2, a fourth distribution transformer T84 for distributing the second RF signal RF2 distributed in third distribution transformer T83, a first mixer transformer T85 for mixing the first RF signal RF1 distributed in first distribution transformer T81 and the second RF signal RF2 distributed in fourth distribution transformer T84 and then outputting an RF signal RF4, a second mixer transformer T86 for mixing the first RF signal RF1 distributed in second distribution transformer T82 and the second RF signal RF2 distributed in fourth distribution transformer T84 and then outputting an RF signal RF4, and a third mixer transformer T87 for mixing the first RF signal RF1 distributed in second distribution transformer T82 and the second RF signal RF2 distributed in third distribution transformer T83 and then outputting an RF signal RF4.

Figure 9:
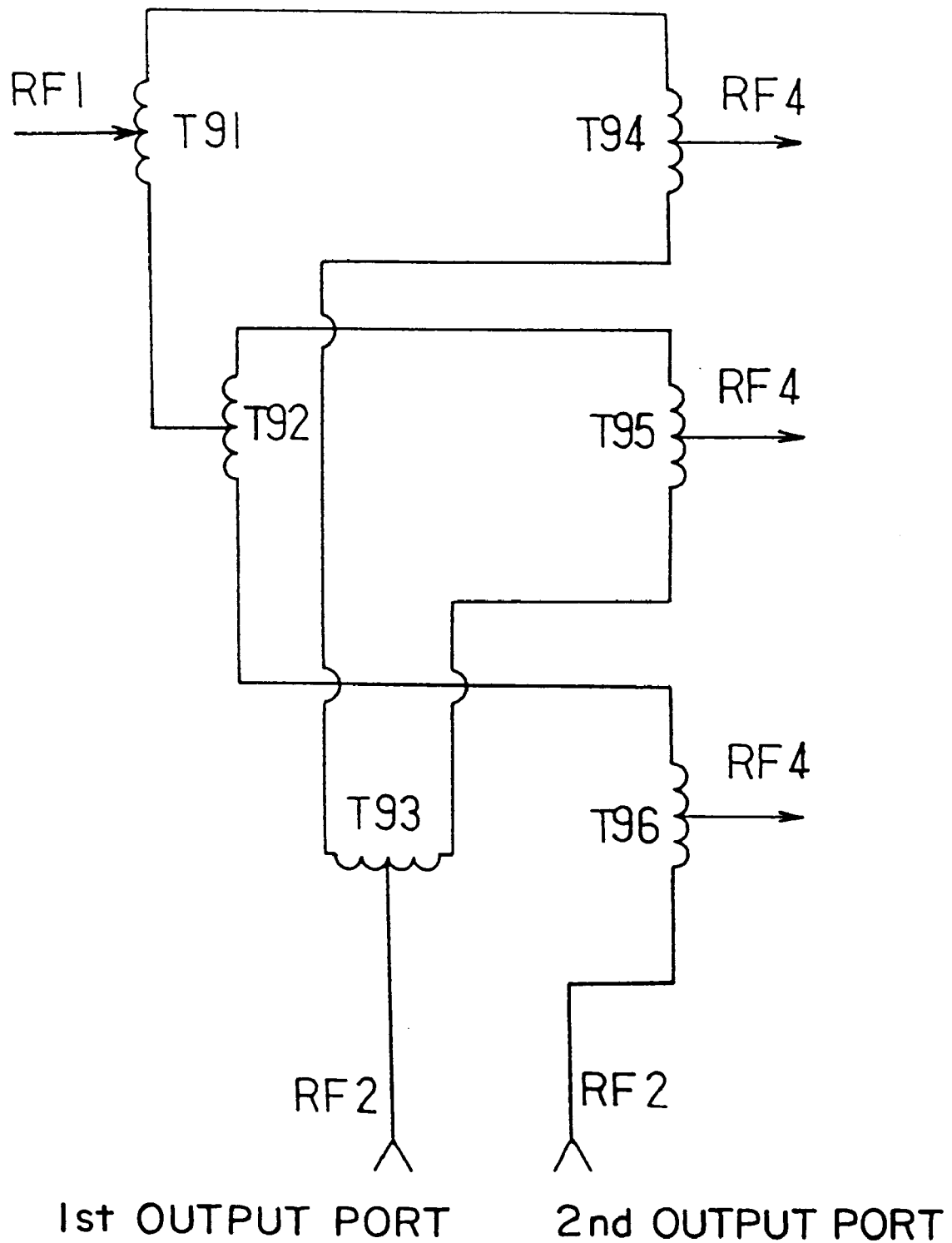
FIG. 9 is a circuit diagram of a fifth embodiment of the mixer/splitter in the second embodiment of the RF modulator of the present invention.

The fifth embodiment of the mixer/splitter of the present invention is shown in FIG. 9 that depicts the second embodiment of the multi-tap modulator of the present invention.

This embodiment of the mixer/splitter has a first distribution transformer T91 for distributing the first RF signal RF1, a second distribution transformer T92 for distributing the first RF signal RF1 distributed in first distribution transformer T91, a third distribution transformer T93 for distributing the second RF signal RF2 of the first output port of modulation section 72, a first mixer transformer T94 for mixing the first RF signal RF1 distributed in first distribution transformer T91 and the second RF signal RF2 distributed in third distribution transformer T93 and then outputting an RF signal RF4, a second mixer transformer T95 for mixing the first RF signal RF1 distributed in second distribution transformer T82 and the second RF signal RF2 distributed in third distribution transformer T93 and then outputting an RF signal RF4, and a third mixer transformer T96 for mixing the first RF signal RF1 distributed in second distribution transformer T92 and the second RF signal RF2 of the second output port of modulation section 72 and then outputting an RF signal RF4.

The three-tap modulator operates like the double-tap, and thus the operation will not be stated.

The two embodiments of RF modulator enable a subscriber to view at least two TV sets, and however, the channel is controlled only by the signal operated in the main TV. In order to allow the channel to be controlled by the signal operated in another TV set, the sub-TV, an accessory circuit is additionally installed to the RF output taps.

Figure 10:
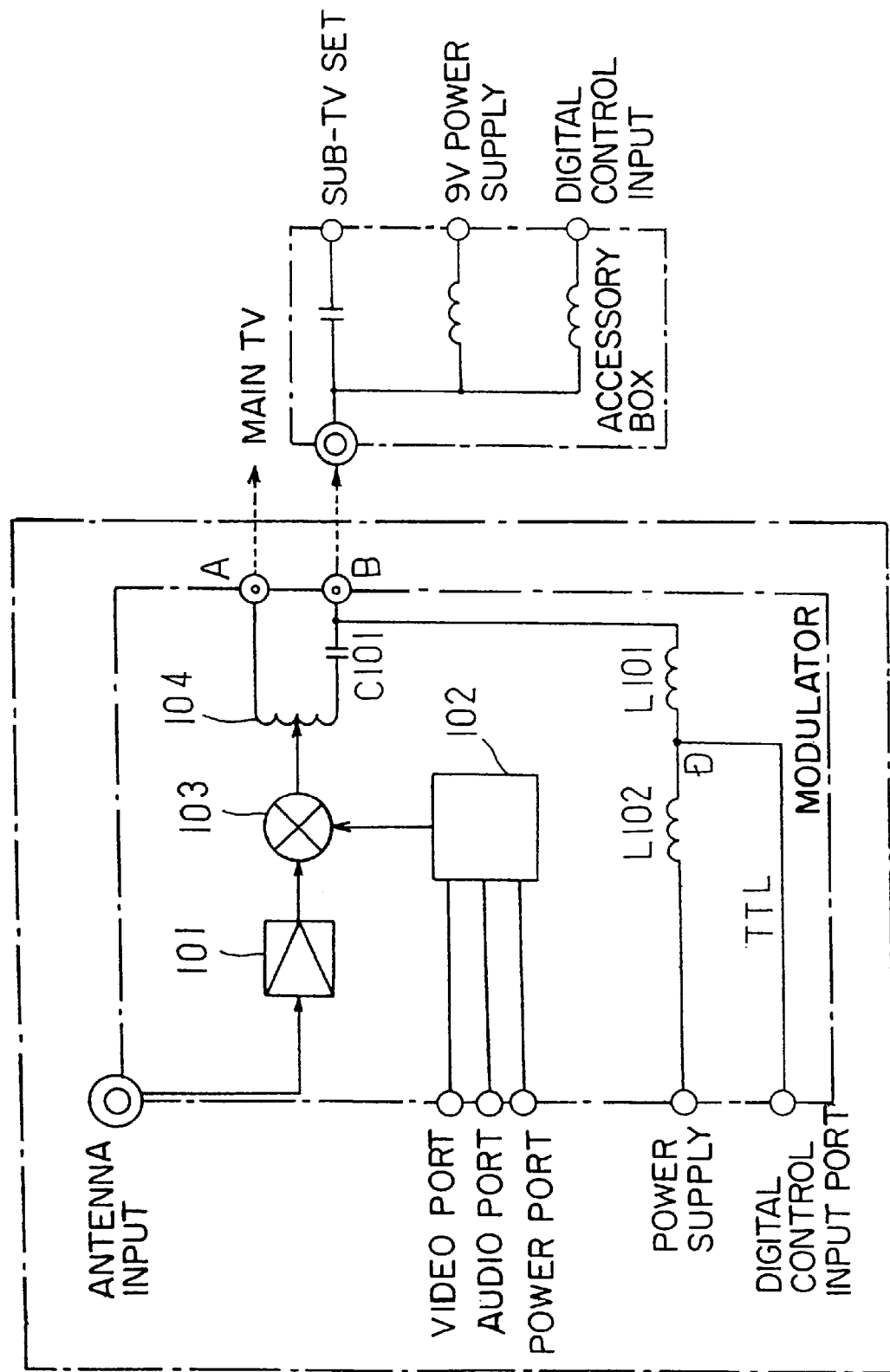
FIG. 10 is a circuit diagram in which a set top box (STB) having the first embodiment of double-tap RF modulator is connected to an accessory box.

FIG. 10 shows an accessory circuit that connects an STB including the double-tap RF modulator of the present invention to a sub-TV set. One tap A of the two is connected to the main TV set, and other tap B to the sub-TV set via the accessory box. The output tap B generates the modulator's RF signal to the sub-TV set, supplies the direct current from the STB to the accessory box, and sends a digital control signal that controls broadcasting reception to the STB from the accessory box. For this, a capacitor C101 is connected between the output port of modulator splitter 104 and RF output tap B. Two coils L101 and L102 are coupled in series between the power supply port of STB and the connection node C where capacitor C101 and RF output tap B are connected. The connection node D where two coils L101 and L102 are connected is coupled to the digital input port of STB.

The RF signal output from splitter 104 is applied to RF output tap B via capacitor C101, and transmitted to the accessory box to be output to the sub-TV set. The RF signal output from splitter 104 is interrupted by two coils L101 and L102, and thus does not affect the power supply port and digital input port of the STB. The direct current output from the power supply port of the STB is applied to RF output tap B via two coils L101 and L102, and sent to the accessory box to be used as its power source. The direct current output from the power supply port of the STB is interrupted by capacitor C101, and is prevented from being transmitted to splitter 104, mixer 103, modulation section 102, and amplifier 101, not affecting the modulator. When the digital control signal for controlling broadcasting reception by operating the STB is input from the sub-TV set, the control signal is input to the digital control input port of the STB via coil L101 so that the sub-TV set is capable of controlling the STB via the accessory box.

According to the embodiments of the present invention constructed and operated as above, more than one output tap of modulator is provided to view several TV sets at the same time. With a single modulator, TV, video tape, satellite broadcasting can be watched, as well as game play. This structure reduces the volume, enables easy mounting on VCR, and is cost-efficient, as compared with several TVs installed in parallel. Other effect of the present invention is that the sub-TV can be controlled by connecting the modulator to the STB via an accessory box.

It will be apparent to the reader that the foregoing description of the invention has been presented for purposes of illustration and description and for providing an understanding of the invention and that many changes and modifications can be made without departing from the scope of the invention. It is therefore intended that the scope of the invention be indicated by the appended claims rather than by the foregoing description of the (first to fifth) embodiments of RF modulator mixer; and all changes which come within the meaning and range of equivalency of the claims are therefore intended to be embraced therein.

What is claimed is:

1. A multi-tap RF modulator which processes audio/video signals in a set top box (STB) for controlling TV broadcasting reception, the modulator comprising:

an amplifier for amplifying a telecast RF signal input to an antenna input port, and outputting a first RF signal;

a modulator section for outputting a second RF signal which modulates the audio/video signals;

a mixer/splitter for mixing the first RF signal output from the amplifier and the second RF signal output from the modulation section, the mixed RF signals being distributed into more than one RF signal; and more than one RF output tap for providing more than one RF signal to a main TV set and at least one sub-TV set;

a capacitor connected between the output port of the mixer/splitter and the RF output tap connected to the sub-TV set; and first and second inductors connected in series at a node between the capacitor and the RF output tap connected to the sub-TV set, the first and second inductors' other port being connected to a power supply port of the STB which supplies direct-current voltage, the first and second inductors' node being connected to a digital control signal input port of the STB which controls broadcasting reception.

2. The modulator as claimed in claim 1, wherein the control signal input port and power supply port of the STB, the antenna input port and more than one RF output tap are integrally installed in one case, the amplifier, modulation section and mixer/splitter being built in the case.

3. The modulator as claimed in claim 1, wherein the mixer/splitter comprises:

a first distribution transformer for distributing the first RF signal;

a second distribution transformer for distributing the second RF signal; and first and second mixer transformers for mixing the first RF signal distributed in the first distribution transformer and the second RF signal distributed in the second distribution transformer and then outputting an RF signal.

4. The modulator as claimed in claim 1, wherein the mixer/splitter comprises:

a distribution transformer for distributing the first RF signal;

a first mixer transformer for mixing the first RF signal distributed in the distribution transformer and the second RF signal output from the first output port of the modulation section and then outputting an RF signal; and a second mixer transformer for mixing the first RF signal distributed in the distribution transformer and the second RF signal output from the second output port of the modulation section and then outputting an RF signal.

5. The modulator as claimed in claim 1, wherein the mixer/splitter comprises:

a first distribution transformer for distributing the first RF signal;

a second distribution transformer for distributing the first RF signal distributed in the first distribution transformer;

a third distribution transformer for distributing the second RF signal;

a fourth distribution transformer for distributing the second RF signal distributed by the third distribution transformer;

a first mixer transformer for mixing the first RF signal distributed in the first distribution transformer and the second RF signal distributed in the fourth distribution transformer and then outputting an RF signal;

a second mixer transformer for mixing the first RF signal distributed in the second distribution transformer and the second RF signal distributed in the fourth distribution transformer and then outputting an RF signal; and a third mixer transformer for mixing the first RF signal distributed in the second distribution transformer and the second RF signal distributed in the third distribution transformer and then outputting an RF signal.

6. The modulator as claimed in claim 1, wherein the mixer/splitter comprises:

a first distribution transformer for distributing the first RF signal;

a second distribution transformer for distributing the first RF signal distributed in the first distribution transformer;

a third distribution transformer for distributing the second RF signal of the first output port of the modulation section;

a first mixer transformer for mixing the first RF signal distributed in the first distribution transformer and the second RF signal distributed in the third distribution transformer and then outputting an RF signal;

a second mixer transformer for mixing the first RF signal distributed in the second distribution transformer and the second RF signal distributed in the third distribution transformer and then outputting an RF signal; and a third mixer transformer for mixing the first RF signal distributed in the second distribution transformer and the second RF signal of the second output port of the modulation section and then outputting an RF signal.

* * * * *